(12) United States Patent
Kim et al.

(10) Patent No.: US 11,900,720 B2
(45) Date of Patent: Feb. 13, 2024

(54) CIRCUIT BOARD AND SMART CARD FOR FINGERPRINT RECOGNITION INCLUDING THE SAME

(71) Applicant: LG INNOTEK CO., LTD., Seoul (KR)

(72) Inventors: Seung Joon Kim, Seoul (KR); Yong Hyun Gwon, Seoul (KR); Yong Hyun Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 123 days.

(21) Appl. No.: 17/446,541

(22) Filed: Aug. 31, 2021

(65) Prior Publication Data

US 2022/0078906 A1    Mar. 10, 2022

(30) Foreign Application Priority Data

Sep. 7, 2020 (KR) .................. 10-2020-0113646

(51) Int. Cl.
| | | |
|---|---|---|
| *H05K 1/02* | (2006.01) | |
| *G06V 40/12* | (2022.01) | |
| *G06V 40/13* | (2022.01) | |
| *G06K 19/07* | (2006.01) | |
| *H05K 1/09* | (2006.01) | |
| *H05K 1/11* | (2006.01) | |

(52) U.S. Cl.
CPC ..... *G06V 40/1365* (2022.01); *G06K 19/0718* (2013.01); *G06V 40/13* (2022.01); *H05K 1/09* (2013.01); *H05K 1/115* (2013.01)

(58) Field of Classification Search
CPC . H05K 1/02; H05K 1/115; H05K 1/09; G06V 40/13; G06V 40/1365; G06K 19/0718

USPC .......................................................... 174/250
See application file for complete search history.

(56) References Cited

U.S. PATENT DOCUMENTS

| | | |
|---|---|---|
| 9,892,304 B2 | 2/2018 | Chang et al. |
| 10,282,652 B2 | 5/2019 | Ottobon et al. |
| 11,100,351 B2 | 8/2021 | Im et al. |
| 2008/0197479 A1 | 8/2008 | Kim et al. |
| 2016/0283776 A1 | 9/2016 | Chang et al. |
| 2017/0213097 A1 | 7/2017 | Vogel et al. |
| 2019/0392283 A1 | 12/2019 | Finn et al. |

(Continued)

FOREIGN PATENT DOCUMENTS

| | | |
|---|---|---|
| CN | 103886299 A | 6/2014 |
| CN | 104766053 A | 7/2015 |
| CN | 108021288 A | 5/2018 |

(Continued)

OTHER PUBLICATIONS

European Search Report dated Feb. 23, 2022 in European Application No. 21193299.1.

(Continued)

*Primary Examiner* — Tremesha S Willis
(74) *Attorney, Agent, or Firm* — SALIWANCHIK, LLOYD & EISENSCHENK

(57) ABSTRACT

A circuit board according to an embodiment includes: a substrate including one surface and the other surface; a first circuit pattern disposed on the one surface; and a second circuit pattern disposed on the other surface, wherein at least one via is formed in the substrate, and the first circuit pattern and the second circuit pattern are wire-bonded through the via to conduct electricity.

20 Claims, 5 Drawing Sheets

(56) References Cited

U.S. PATENT DOCUMENTS

2021/0174111 A1   6/2021  Im et al.

FOREIGN PATENT DOCUMENTS

| CN | 208092769 U    | 11/2018 |
| CN | 111512447 A    | 8/2020  |
| EP | 3 059 698 A1   | 8/2016  |
| KR | 10-2018-0106737 A | 10/2018 |

OTHER PUBLICATIONS

Office Action dated Apr. 4, 2023 in Chinese Application No. 202111037931.5.

CIRCUIT BOARD AND SMART CARD FOR FINGERPRINT RECOGNITION INCLUDING THE SAME

CROSS-REFERENCE TO RELATED APPLICATION

This application claims priority under 35 U.S.C. 119 to Korean Application No. 10-2020-0113646, filed Sep. 7, 2020, which is herein incorporated by reference in its entirety.

TECHNICAL FIELD

An embodiment relates to a circuit board and a card for fingerprint recognition including the same.

BACKGROUND ART

Since people's fingerprints are all different for each person, they are widely used for a purpose of identifying individuals. In particular, the fingerprints are used as a means of personal authentication for authenticating an individual in various fields such as finance and security. A fingerprint recognition sensor has been developed to identify an individual by recognizing such fingerprints. The fingerprint recognition sensor is a device that touches a person's finger and recognizes a finger fingerprint, and is used as a means for determining whether a user is a legitimate user. Such fingerprint sensors are classified into an optical sensor, a capacitive sensor, an ultrasonic sensor, and a thermal sensor according to the principle of fingerprint sensing. Each type of fingerprint sensor may acquire fingerprint image data from a finger according to each driving principle.

Meanwhile, recently, a smart IC card that operates according to a user's authentication by embedding the fingerprint recognition sensor in a smart card including an IC chip has been developed.

Such a smart IC card for fingerprint recognition may be applied to a traffic card, an ID card, various wearable devices, etc. through a contact pad of the smart IC after determining whether the user is a designated user by the fingerprint recognition sensor.

Meanwhile, the contact pad of the smart IC may have a circuit pattern disposed on both surfaces of a substrate, and one surface may operate as a contact side, and the other surface may operate as a bonding side.

In detail, the contact pad is connected to a chip embedded in the smart IC card through the bonding side, and the smart IC card may operate through the contact side that is electrically connected to the bonding side.

Accordingly, each of the circuit patterns disposed on both surfaces of the substrate should be electrically connected to each other. To this end, vias may be formed in the substrate and the circuit patterns may be connected through via plating.

However, the via plating process has problems that process efficiency is deteriorated, such as a long process time and a separate plating layer forming process being required. Therefore, there are required a circuit board having a new structure capable of solving the above problems and a smart card for fingerprint recognition including the same.

SUMMARY

Technical Problem

An embodiment is directed to providing a circuit board capable of being easily manufactured and improving adhesion with a card module, and a smart card for fingerprint recognition including the same.

Technical Solution

A circuit board according to an embodiment includes: a substrate including one surface and the other surface; a first circuit pattern disposed on the one surface; and a second circuit pattern disposed on the other surface, wherein at least one via is formed in the substrate, and the first circuit pattern and the second circuit pattern are wire-bonded through the via to conduct electricity.

Advantageous Effects

A circuit board according to an embodiment may conduct electricity with each other by wire bonding a first circuit pattern and a second circuit pattern through vias.

Accordingly, a process of forming a via plating layer in order to conduct electricity between the first circuit pattern and the second circuit pattern may be omitted.

Therefore, it is possible to inhibit deterioration of process efficiency due to an increase in process time due to the formation of the via plating layer.

In addition, in the circuit board according to the embodiment, a connection region between the second circuit pattern and a wire may be all disposed in a region corresponding to one circuit pattern portion among a plurality of first circuit patterns.

Accordingly, an area of the molding member for molding the connection region may be reduced.

Therefore, when the circuit board is adhered to a card body, an area of an adhesive region of the circuit board may be increased, thereby facilitating adhesion between the circuit board and the card body and improving adhesion.

DETAILED DESCRIPTION OF THE EMBODIMENTS

Hereinafter, embodiments of the present disclosure will be described in detail with reference to the accompanying drawings. However, the spirit and scope of the present disclosure is not limited to a part of the embodiments described, and may be implemented in various other forms, and within the spirit and scope of the present disclosure, one or more of the elements of the embodiments may be selectively combined and replaced.

In addition, unless expressly otherwise defined and described, the terms used in the embodiments of the present disclosure (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present disclosure are for describing the embodiments and are not intended to limit the present disclosure. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present disclosure, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a circuit board according to an embodiment and a smart card for fingerprint recognition including the same will be described with reference to FIG. 1.

Figure 1:
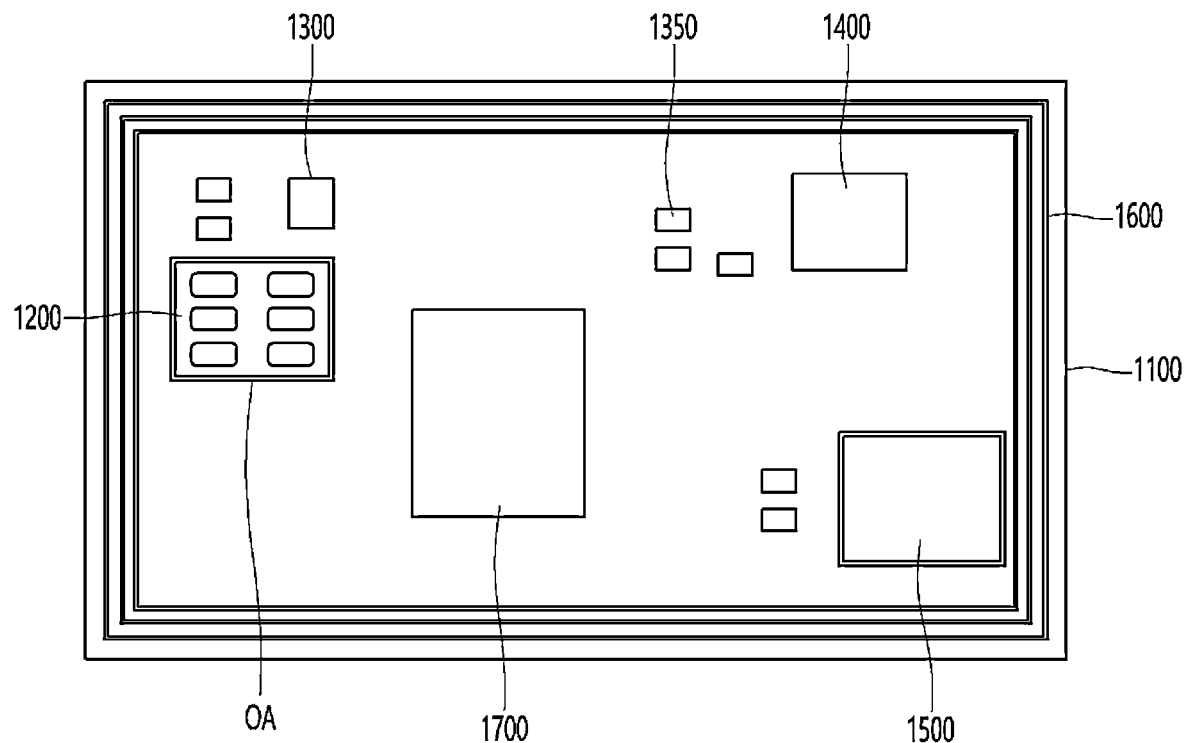
FIG. 1 is a view showing a top view of a card for fingerprint recognition according to an embodiment.

FIG. 1 is a view showing a top view of the smart card for fingerprint recognition according to the embodiment.

Referring to FIG. 1, a fingerprint recognition smart card 1000 may include a card body 1100, a circuit board 1200 accommodated in the card body 1100, a chip 1300, a micro controller unit (MCU) 1400, a connection circuit pattern 1350 electrically connecting the chip 1300 and the micro controller unit 1400, a fingerprint sensor 1500, an antenna 1600, and a battery 1700.

The circuit board 1200 may be accommodated in the card body 1100. In detail, an opening OA for accommodating the circuit board 1200 is formed in the card body 2000, and the circuit board 1200 may be inserted and adhered to the opening OA.

Accordingly, any one of one surface and the other surface of the circuit board 1200 may be exposed to the outside of the smart card for fingerprint recognition.

The smart card for fingerprint recognition may include the fingerprint sensor 1500. The fingerprint sensor 1500 may recognize a user's fingerprint and match fingerprint information stored in the chip 1300.

That is, one or more predetermined pieces of user's fingerprint information are stored in the chip 1300, and the fingerprint recognized through the fingerprint sensor 1500 and the fingerprint information stored in the chip 1300 may be matched to compare with each other.

For example, when a user's finger is in contact with the fingerprint sensor 1500, power is supplied from the battery 1700 to the micro controller unit 1400, and the fingerprint sensor 1500 supplied with the power by the micro controller unit 1400 may be driven.

Subsequently, the micro controller unit 1400 may receive the fingerprint information recognized through the fingerprint sensor 1500, and an authentication process of the recognized fingerprint information may be performed.

Subsequently, when the recognized fingerprint information and the fingerprint information stored in the chip 1300 match, the circuit board 1200 that is connected to the chip 1300 to serve as a contact pad may be activated, and a function of the smart card for fingerprint recognition may also be activated.

On the other hand, when the recognized fingerprint information and the fingerprint information stored in the chip 1300 do not match, the circuit board 1200 connected to the chip 1300 may be deactivated, and the function of the smart card for fingerprint recognition may be also deactivated.

In addition, the smart card for fingerprint recognition may include the antenna 1600. Accordingly, the smart card for fingerprint recognition may operate as a contactless card. That is, even in a non-contact state with the card reader, information may be wirelessly transmitted and received to and from a server through the antenna of the smart card for fingerprint recognition.

However, the embodiment is not limited thereto, the smart card for fingerprint recognition does not include the antenna 1600, and the smart card for fingerprint recognition may operate as a contact card. That is, the smart card for fingerprint recognition is inserted into the card reader and may transmit and receive information to and from the server due to contact with the circuit board.

Meanwhile, in order to drive the smart card for fingerprint recognition according to the fingerprint recognition as described above, the circuit board 1200, the chip 1300, and the fingerprint sensor 1500 should be electrically connected to each other.

In particular, in the case of the smart card for fingerprint recognition, a lot of information such as fingerprint recognition and fingerprint matching of the fingerprint sensor 1500 is required, and accordingly, a plurality of circuit patterns connected to the chip 1300 are required, and thus a space for the chip and the circuit pattern is required. Accordingly, it is difficult to directly mount the chip on the circuit board, and the chip 1300 disposed outside the circuit board 1200 may be connected to the circuit board 1200.

That is, the circuit board 1200 includes a contact side and a bonding side and is connected to an external chip through the bonding side, and the circuit board 1200 may be activated or deactivated through the information received from the fingerprint sensor 1500 and the chip 1300.

Meanwhile, the circuit board 1200 includes a substrate 100, and circuit patterns are respectively disposed on one surface and the other surface of the substrate 100. Electricity should be conducted on the circuit patterns disposed on one surface and the other surface of the substrate in order to operate the circuit board.

In this case, there is a problem that process efficiency is deteriorated due to a longer process time for conducting electricity the circuit patterns.

The circuit board according to the embodiment is intended to improve the process efficiency by easily connecting the circuit patterns of the bonding side and the contact side as described above.

FIGS. 2 to 5 are views for describing a circuit board according to an embodiment.

Referring to FIGS. 2 to 5, the circuit board 1200 may include the substrate 100. The substrate 100 may be an insulating substrate. The substrate 100 may include a resin material. The substrate 100 may include one surface 110 and the other surface 120. The one surface 110 may be defined as a surface corresponding to the contact side of the circuit pattern described above, and the other surface 120 may be defined as a surface corresponding to the bonding side of the circuit pattern described above.

The substrate 100 may include prepreg including glass fiber. In detail, the substrate 100 may include an epoxy resin and a material in which glass fiber and a silicon-based filler are dispersed in the epoxy resin.

In addition, the substrate 100 may be rigid or flexible. For example, the substrate 100 may include glass or plastic. In detail, the substrate 100 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, the substrate 100 may include a photoisotropic film. For example, the substrate 100 may include cyclic olefin copolymer (COC), cyclic olefin polymer (COP), photoisotropic polycarbonate (PC), photoisotropic polymethyl methacrylate (PMMA), or the like.

Further, the substrate 100 may be partially bent while having a curved surface. That is, the substrate 100 may partially have a plane and may partially be bent while having a curved surface. In detail, an end portion of the substrate 100 may be bent while having a curved surface or may be bent or crooked while having a surface with a random curvature.

Furthermore, the substrate 100 may be a flexible substrate having flexibility. Also, the substrate 100 may be a curved or bent substrate.

An adhesive layer 200 may be disposed on the one surface 110 and the other surface 120 of the substrate 100. The adhesive layer 200 may be disposed on the entire surface of the one surface and the other surface of the substrate 100. In detail, the adhesive layer 200 may be disposed on the entire surface of the one surface and the other surface of the substrate except for a via-formed region.

The adhesive layer 200 may include a resin material. For example, the adhesive layer 200 may include at least one of an epoxy resin, an acrylic resin, and a polyimide resin. In addition, the adhesive layer 200 may further include additives such as natural rubber, a plasticizer, a hardner, a phosphorus-based flame retardant, and the like in order to impart flexibility to the adhesive layer 200.

Circuit patterns may be respectively disposed on the one surface 110 and the other surface 120 of the substrate 100.

In detail, a first circuit pattern 310 may be disposed on the one surface 110, and a second circuit pattern 320 may be disposed on the other surface 120.

For example, the first circuit pattern 310 may be a circuit pattern disposed on the contact side of the circuit board, and the second circuit pattern 320 may be a circuit pattern disposed on the bonding side of the circuit board.

The first circuit pattern 310 and the second circuit pattern 320 may be disposed on the adhesive layer 200 on the substrate 100.

The first circuit pattern 310 may include a first metal layer 301 and a second metal layer 302 disposed on the first metal layer 301. In addition, the second circuit pattern 320 may include a third metal layer 303 and a fourth metal layer 304 disposed on the third metal layer 303.

The first metal layer 301 and the third metal layer 303 may include a metal material. In detail, the first metal layer 301 and the third metal layer 303 may include a metal material having high electrical conductivity. For example, the circuit pattern 300 may include at least one of gold (Au), silver (Ag), platinum (Pt), titanium (Ti), tin (Sn), copper (Cu), and zinc (Zn). Preferably, the first metal layer 301 and the third metal layer 303 may include copper (Cu).

The second metal layer 302 and the fourth metal layer 304 may be disposed on the first metal layer 301 and the third metal layer 303, respectively.

The second metal layer 302 and the fourth metal layer 304 may be disposed on the first circuit pattern 310 and the second circuit pattern 320 to protect the first circuit pattern 310 and the second circuit pattern 320.

In detail, the second metal layer 302 and the fourth metal layer 304 may include nickel-gold (Ni—Au) or nickel-lead (Ni—Pd), but the embodiment is not limited thereto. The second metal layer 302 and the fourth metal layer 304 may implement various colors depending on the type of material to give a color to the contact side of the smart IC module and inhibit corrosion of the circuit pattern.

Figure 2:
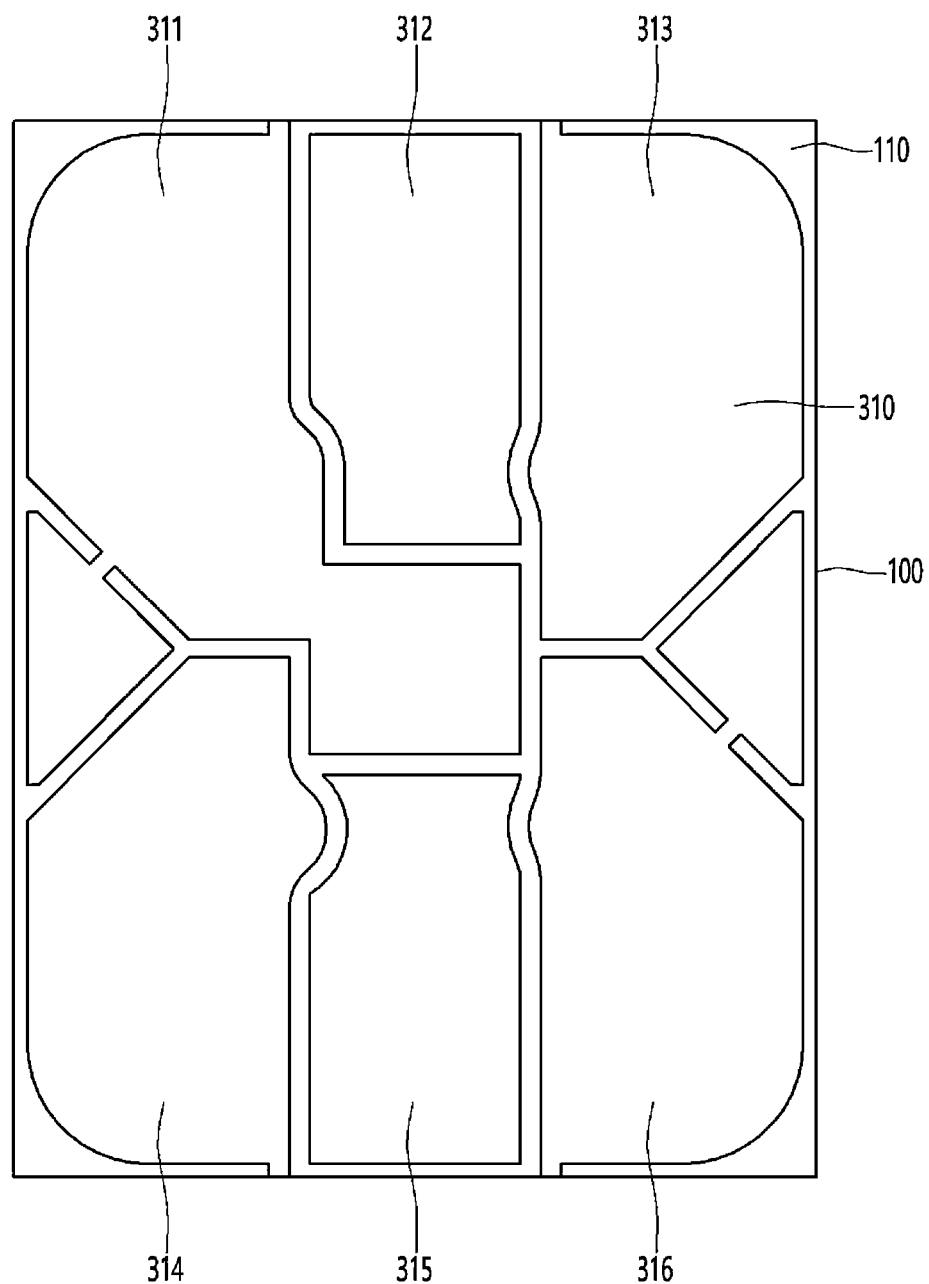
FIG. 2 is a view showing a top view of a first surface of a circuit board according to an embodiment.

Referring to FIG. 2, the first circuit pattern 310 disposed on one surface of the substrate 100 may include a plurality of circuit patterns. In detail, the first circuit pattern 310 may include the plurality of circuit patterns spaced apart from each other.

Referring to FIG. 2, the first circuit pattern 310 may include a first circuit pattern portion 311, a second circuit pattern portion 312, a third circuit pattern portion 313, a fourth circuit pattern portion 314, a fifth circuit pattern portion 315, and a sixth circuit pattern portion 316. FIG. 2 illustrates the first circuit pattern portion 311, the second circuit pattern portion 312, the third circuit pattern portion 313, the fourth circuit pattern portion 314, the fifth circuit pattern portion 315, and the sixth circuit pattern portion 316, but the embodiment is not limited thereto, and the first circuit pattern 310 may include less than six or more than six circuit pattern portions.

The first circuit pattern portion 311, the second circuit pattern portion 312, the third circuit pattern portion 313, the fourth circuit pattern portion 314, the fifth circuit pattern portion 315, and the sixth circuit pattern portions 316 may be disposed to be spaced apart from each other.

Figure 3:
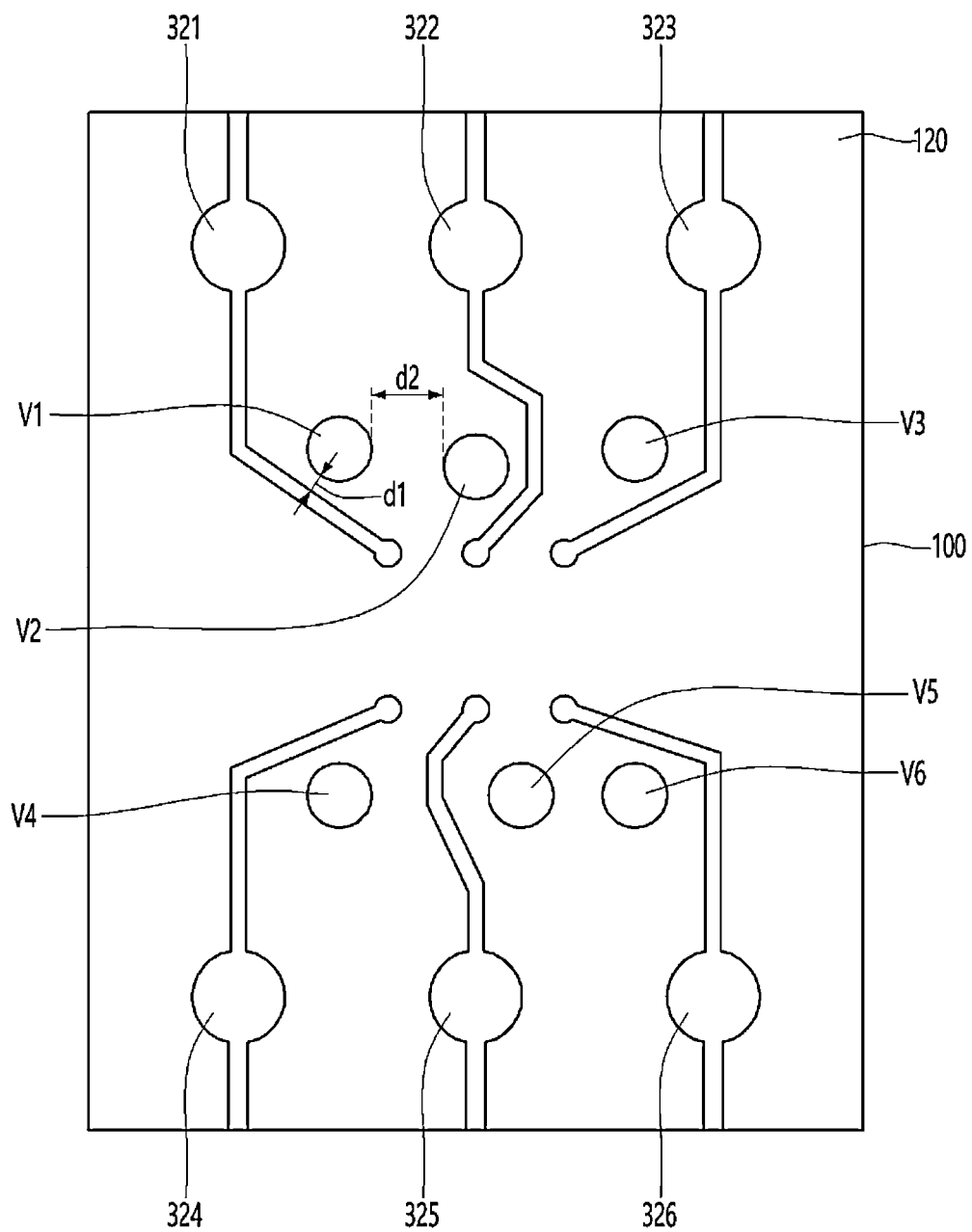
FIG. 3 is a view showing a top view of a second surface of the circuit board according to the embodiment.

In addition, referring to FIG. 3, the second circuit pattern 320 may include a seventh circuit pattern portion 321, an eighth circuit pattern portion 322, a ninth circuit pattern portion 323, a tenth circuit pattern portion 324, an eleventh circuit pattern portion 325, and a twelfth circuit pattern portion 326.

FIG. 3 illustrates the seventh circuit pattern portion 321, the eighth circuit pattern portion 322, the ninth circuit pattern portion 323, the tenth circuit pattern portion 324, the eleventh circuit pattern portion 325, and the twelfth circuit pattern 326, but the embodiment is not limited thereto, and the second circuit pattern 320 may include less than six or more than six circuit pattern portions.

The seventh circuit pattern portion 321, the eighth circuit pattern portion 322, the ninth circuit pattern portion 323, the tenth circuit pattern portion 324, the eleventh circuit pattern portion 325, and the twelfth circuit pattern portions 326 may be disposed to be spaced apart from each other.

The seventh circuit pattern portion 321, the eighth circuit pattern portion 322, the ninth circuit pattern portion 323, the tenth circuit pattern portion 324, the eleventh circuit pattern portion 325, and the twelfth circuit pattern portion 326 may be connected to the first circuit pattern 310 disposed on one surface of the substrate 100.

To this end, a plurality of vias may be formed in regions corresponding to the respective first circuit patterns 310 on the other surface of the substrate 100.

In detail, a plurality of vias passing through the adhesive layer 200 and the substrate 100 may be formed on the other surface 120 of the substrate 100.

Accordingly, on the other surface 120 of the substrate 100, a first via V1 may be formed in a region corresponding to the first circuit pattern portion 311, a second via V2 may be formed in a region corresponding to the second circuit pattern portion 312, a third via V3 may be formed in a region corresponding to the third circuit pattern portion 313, a fourth via V4 may be formed in the a region corresponding to the fourth circuit pattern portion 314, a fifth via V5 may be formed in a region corresponding to the fifth circuit pattern portion 315, and a sixth via V6 may be formed in a region corresponding to the sixth circuit pattern portion 316.

Figure 4:
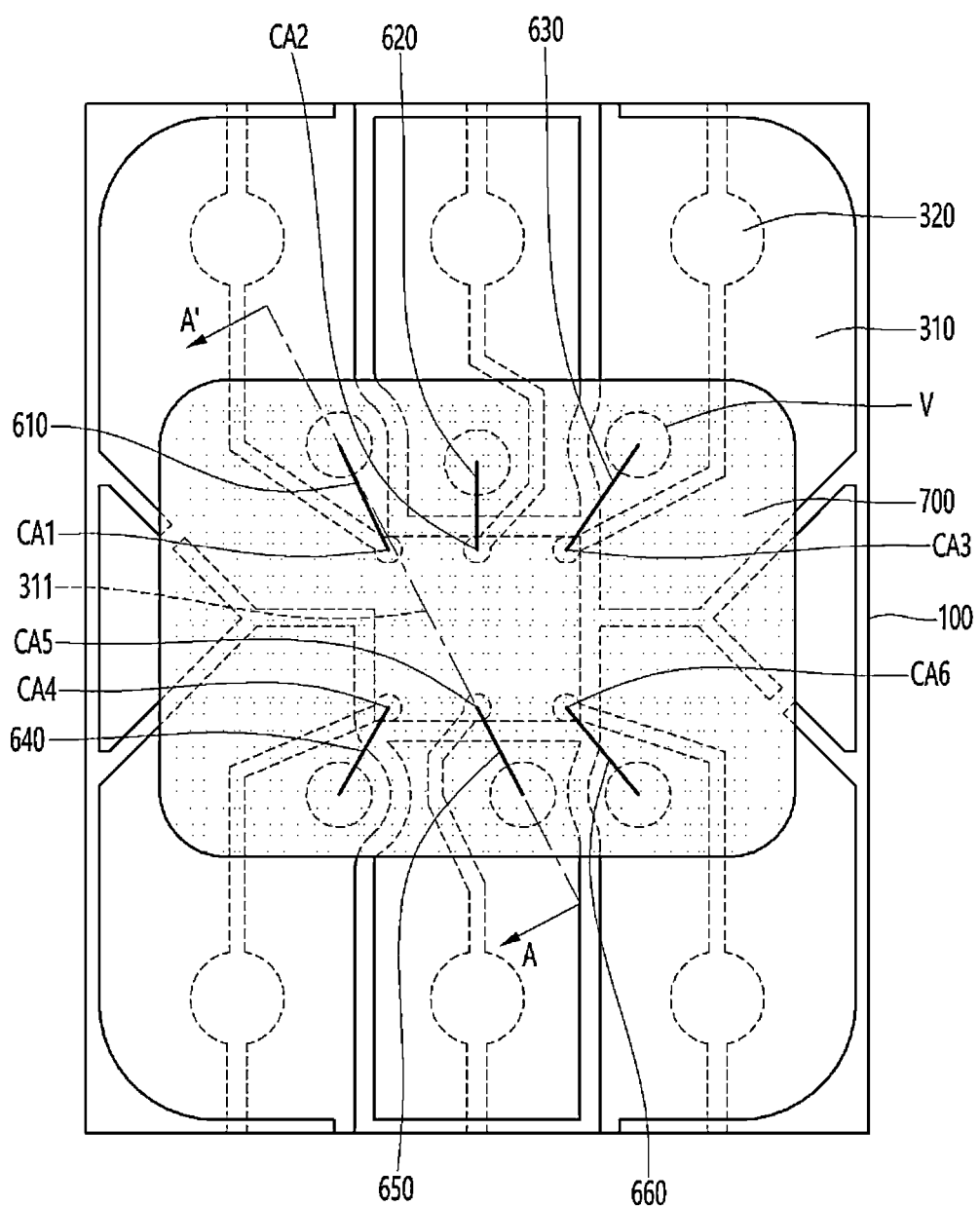
FIG. 4 is a top view of the first surface of the circuit board according to the embodiment and is a view showing both a first circuit pattern and a second circuit pattern.
Figure 5:
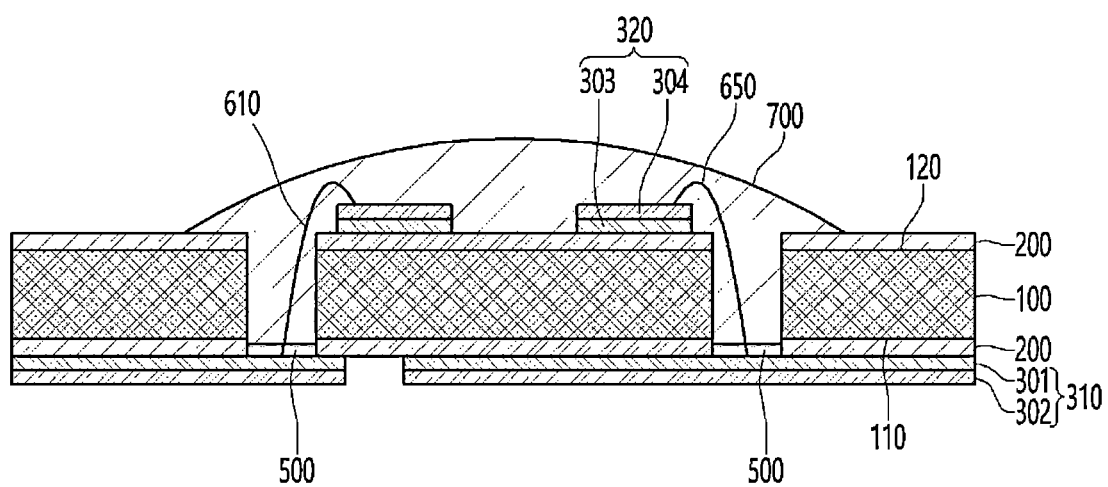
FIG. 5 is a view showing a cross-sectional view taken along line A-A' of FIG. 4.

Referring to FIG. 4, the first circuit pattern 310 and the second circuit pattern 320 may be connected to each other through the vias.

In detail, the first circuit pattern 310 and the second circuit pattern 320 may be electrically connected through wire bonding using a wire. That is, the wire connected to the second circuit pattern 320 may be connected to the first circuit pattern through the via. Meanwhile, a pad portion 500 may be disposed on one surface of the first circuit pattern 310 in contact with the wire. The pad portion 500 may include a material the same as or similar to that of the fourth metal layer 304 described above. For example, the pad portion 500 may include nickel-gold (Ni—Au) or nickel-lead (Ni—Pd), but the embodiment is not limited thereto. The first circuit pattern portion 311 and the seventh circuit pattern portion 321 may be connected to a first wire 610 through the first via V1, the second circuit pattern portion 312 and the eighth circuit pattern portion 322 may be connected to a second wire 620 through the second via V2, the third circuit pattern portion 313 and the ninth circuit pattern portion 323 may be connected to a third wire 630 through the third via V3, the fourth circuit pattern portion 314 and the tenth circuit pattern portion 324 may be connected to a fourth wire 640 through the fourth via V4, the fifth circuit pattern portion 315 and the eleventh circuit pattern portion 325 may be connected to a fifth wire 650 through the fifth via V5, and the sixth circuit pattern portion 316 and the twelfth circuit pattern portion 326 may be connected to a sixth wire 660 through the sixth via V6.

Accordingly, the first circuit pattern 310 and the second circuit pattern 320 may be electrically connected to conduct electricity to each other.

In the related art, a via was formed to conduct electricity between the first circuit pattern and the second circuit pattern, and a via plating layer was formed on the via to connect the first circuit pattern and the second circuit pattern.

However, a process for forming the plating layer inside the via is added, and a process time is increased due to a process time of forming the plating layer, so that process efficiency of manufacturing the circuit board may be deteriorated.

However, in the circuit board according to the embodiment, the process of forming the via plating layer is omitted, and the first circuit pattern and the second circuit pattern are wire-bonded through the via to connect the first circuit pattern and the second circuit pattern, and thus, the connection may be facilitated and the manufacturing process efficiency of the circuit board may be improved.

Meanwhile, referring to FIG. 4, one ends of the first wire 610, the second wire 620, the third wire 630, the fourth wire 640, the fifth wire 650, and the sixth wire 660 may be all connected to the second circuit pattern 320 in a region corresponding to a single first circuit pattern 310.

That is, a first connection region CA1 of the seventh circuit pattern portion 321 and the first wire 610, a second connection region CA2 of the eighth circuit pattern portion 322 and the second wire 620, a third connection region CA3 of the ninth circuit pattern portion 323 and the third wire 630, a fourth connection region CA4 of the tenth circuit pattern portion 324 and the fourth wire 640, a fifth connection region CA5 of the eleventh circuit pattern portion 325 and the fifth wire 650, and a sixth connection region CA6 of the twelfth circuit pattern portion 326 and the sixth wire 660 may be disposed at a position overlapping one circuit pattern among a plurality of circuit pattern portions disposed on the one surface 110 of the substrate 100. For example, referring to FIG. 4, the first connection region CAL the second connection region CA2, the third connection region CA3, the fourth connection region CA4, the fifth connection region CA5, and the sixth connection region CA6 may overlap only the first circuit pattern portion 311 of the first circuit patterns disposed on the one surface 110 of the substrate 100 and may not overlap other circuit pattern portions.

Accordingly, when forming a molding member 700 for protecting the first connection region CAL the second connection region CA2, the third connection region CA3, the fourth connection region CA4, the fifth connection region CA5, and the sixth connection region CA6, an area of the molding member 700 may be reduced.

That is, the first connection region CAL the second connection region CA2, the third connection region CA3, the fourth connection region CA4, the fifth connection region CA5, and the sixth connection region CA6 are not dispersed but concentrated in one region, and thus, it is possible to inhibit the area of the molding member 700 from increasing when the connection regions are molded.

The substrate 100 may be coupled to the card body 2000 on the other surface 120 that is a bonding side. At this time, an adhesive region for adhering to the card body 2000 is formed on the other surface 120 of the substrate 100. As the area of the molding member 700 increases, a position of the adhesive region is limited, and an area of the adhesive region may be reduced. However, in the circuit board according to the embodiment, the area of the adhesive region of the circuit board may be increased by reducing the area of the molding member 700. In addition, referring to FIG. 3, a distance between the via and the second circuit pattern 320 may be smaller than a distance between the vias. In detail, a minimum distance d1 between the via and the second circuit pattern 320 may be smaller than a minimum distance d2 between adjacent vias.

Accordingly, when wire bonding the second circuit pattern 320 and the first circuit pattern 310 through the via, a length of the wire may be inhibited from increasing, and the first circuit pattern 310 and the second circuit pattern 320 may be stably wire-bonded by reducing the distance between the second circuit pattern 320 and the via.

The circuit board according to the embodiment may conduct electricity with each other by wire bonding the first circuit pattern and the second circuit pattern through the vias.

Accordingly, a process of forming a via plating layer in order to conduct electricity between the first circuit pattern and the second circuit pattern may be omitted.

Therefore, it is possible to inhibit deterioration of process efficiency due to an increase in process time due to the formation of the via plating layer.

In addition, in the circuit board according to the embodiment, the connection region between the second circuit pattern and the wire may be all disposed in a region corresponding to one circuit pattern portion among the plurality of first circuit patterns.

Accordingly, the area of the molding member for molding the connection region may be reduced.

Therefore, when the circuit board is adhered to the card body, the area of the adhesive region of the circuit board can be increased, thereby facilitating adhesion between the circuit board and the card body and improving adhesion.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present disclosure.

In addition, embodiments are mostly described above, but the embodiments are merely examples and do not limit the present disclosure, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present disclosure defined in the following claims.

What is claimed is:

1. A circuit board comprising:
a substrate including one surface and an other surface;
a first circuit pattern disposed on the one surface;
a second circuit pattern disposed on the other surface,
a first adhesive layer on the one surface of the substrate; and
a second adhesive layer on the other surface of the substrate,
wherein the first circuit pattern directly contacts the first adhesive layer,
wherein the second circuit pattern directly contacts the second adhesive layer,
wherein a plurality of vias are formed in the substrate, and the first circuit pattern and the second circuit pattern are wire-bonded through one of the vias to conduct electricity.

2. The circuit board of claim 1, wherein the first circuit pattern includes a plurality of first circuit pattern portions spaced apart from each other,
the second circuit pattern includes a plurality of second circuit pattern portions spaced apart from each other, and
connection regions of a plurality of wires connected to the plurality of second circuit patterns are disposed in a region corresponding to one of the plurality of first circuit pattern portions.

3. The circuit board of claim 1, wherein a minimum distance between the second circuit pattern and the vias is smaller than a minimum distance between adjacent vias.

4. The circuit board of claim 1, wherein the first circuit pattern or the second circuit pattern is electrically connected to a fingerprint sensor and a chip.

5. The circuit board of claim 1, wherein the one surface is a contact side, and the other surface is a bonding side connected to an external chip.

6. The circuit board of claim 1, comprising
an adhesive layer disposed between the substrate and the first circuit pattern and between the substrate and the second circuit pattern.

7. The circuit board of claim 1, wherein a pad portion is disposed on one surface of the first circuit pattern and is in contact with the wire.

8. The circuit board of claim 1, wherein the first circuit pattern includes a first metal layer and a second metal layer on the first metal layer,
the second circuit pattern includes a third metal layer and a fourth metal layer on the third metal layer,
the first metal layer and the third metal layer include at least one of gold (Au), silver (Ag), platinum (Pt), titanium (Ti), tin (Sn), copper (Cu), and zinc (Zn), and
the second metal layer and the fourth metal layer include nickel-gold (Ni—Au) or nickel-lead (Ni—Pd).

9. The circuit board of claim 1, wherein the first circuit pattern includes a first circuit pattern portion, a second circuit pattern portion, a third circuit pattern portion, a fourth circuit pattern portion, a fifth circuit pattern portion, and a sixth circuit pattern portion that are disposed to be spaced apart from one another, and
the second circuit pattern includes a seventh circuit pattern portion, an eighth circuit pattern portion, a ninth circuit pattern portion, a tenth circuit pattern portion, an eleventh circuit pattern portion, and a twelfth circuit pattern portion that are disposed to be spaced apart from one another.

10. The circuit board of claim 9, wherein the seventh circuit pattern portion, the eighth circuit pattern portion, the ninth circuit pattern portion, the tenth circuit pattern portion, the eleventh circuit pattern portion, and the twelfth circuit pattern portion are connected to one among the first circuit pattern portion, the second circuit pattern portion, the third circuit pattern portion, the fourth circuit pattern portion, the fifth circuit pattern portion, and the sixth circuit pattern portion.

11. The circuit board of claim 9, wherein the seventh circuit pattern portion, the eighth circuit pattern portion, the ninth circuit pattern portion, the tenth circuit pattern portion, the eleventh circuit pattern portion, and the twelfth circuit pattern portion are connected only to a region corresponding to the first circuit pattern portion.

12. The circuit board of claim 10, wherein the plurality of vias include a first via formed in a region corresponding to the first circuit pattern portion, a second via formed in a region corresponding to the second circuit pattern portion, a third via formed in a region corresponding to the third circuit pattern portion, a fourth via formed in a region corresponding to the fourth circuit pattern portion, a fifth via formed in a region corresponding to the fifth circuit pattern portion, and a sixth via formed in a region corresponding to the sixth circuit pattern portion.

13. The circuit board of claim 12, wherein the first circuit pattern portion and the seventh circuit pattern portion are connected to a first wire through the first via,
the second circuit pattern portion and the eighth circuit pattern portion are connected to a second wire through the second via,
the third circuit pattern portion and the ninth circuit pattern portion are connected to a third wire through the third via,
the fourth circuit pattern portion and the tenth circuit pattern portion are connected to a fourth wire through the fourth via, the fifth circuit pattern portion and the eleventh circuit pattern portion are connected to a fifth wire through the fifth via, and the sixth circuit pattern portion and the twelfth circuit pattern portion are connected to a sixth wire through the sixth via.

14. The circuit board of claim 13, comprising a molding member disposed on a first connection region between the seventh circuit pattern portion and the first wire, a second connection region between the eighth circuit pattern portion and the second wire, a third connection region between the ninth circuit pattern portion and the third wire, a fourth connection region between the tenth circuit pattern portion and the fourth wire, a fifth connection region between the eleventh circuit pattern portion and the fifth wire, and a sixth connection region between the twelfth circuit pattern portion and the sixth wire.

15. A smart card for fingerprint recognition comprising:
a card body including an opening; and
a circuit board accommodated in the opening of the card body,
wherein the card body includes:
a chip that stores fingerprint information;
a micro controller unit;
a battery for supplying power to the micro controller unit; and
a fingerprint sensor supplied with the power by the micro controller unit, and the circuit board includes:
a substrate including one surface and the other surface;
a first circuit pattern disposed on the one surface; and
a second circuit pattern disposed on the other surface,
wherein at least one via is formed in the substrate,
wherein the first circuit pattern and the second circuit pattern are wire-bonded through the via to conduct electricity, and
wherein the circuit board is electrically connected to the fingerprint sensor and the chip.

16. The smart card for fingerprint recognition of claim 15, wherein the card body includes an antenna.

17. The circuit board of claim 14, wherein a distance between the first connection region and the first via is smaller than a distance between the first connection region and the fourth connection region.

18. The circuit board of claim 14, wherein a distance between the first connection region and the first via is smaller than a minimum distance between adjacent vias.

19. The circuit board of claim 14, wherein a distance between the first connection region and the second connection region is smaller than a distance between the first via and the third via.

20. The circuit board of claim 14, wherein a size of the connection regions is smaller than a size of the vias.

* * * * *